(12) United States Patent
Mizumoto

(10) Patent No.: US 9,557,659 B2
(45) Date of Patent: Jan. 31, 2017

(54) LITHOGRAPHY APPARATUS, DETERMINATION METHOD, AND METHOD OF MANUFACTURING ARTICLE

(71) Applicant: CANON KABUSHIKI KAISHA, Tokyo (JP)

(72) Inventor: Kazushi Mizumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 216 days.

(21) Appl. No.: 14/511,448

(22) Filed: Oct. 10, 2014

(65) Prior Publication Data

US 2015/0109600 A1    Apr. 23, 2015

(30) Foreign Application Priority Data

Oct. 23, 2013   (JP) ................. 2013-220484

(51) Int. Cl.
| | |
|---|---|
| G03B 27/32 | (2006.01) |
| G03B 27/58 | (2006.01) |
| G03B 27/60 | (2006.01) |
| G03B 27/62 | (2006.01) |
| G03B 27/64 | (2006.01) |
| G03F 7/20 | (2006.01) |
| H01L 21/683 | (2006.01) |

(52) U.S. Cl.
CPC ............. *G03F 7/7075* (2013.01); *G03F 7/707* (2013.01); *H01L 21/6838* (2013.01)

(58) Field of Classification Search
CPC .. G03F 7/70691; G03F 7/707; G03F 7/70733; G03F 7/705; H01L 21/6838

USPC .................................. 355/72, 73, 75, 76, 77
See application file for complete search history.

(56) References Cited

U.S. PATENT DOCUMENTS

| | | | | |
|---|---|---|---|---|
| 2001/0009455 | A1* | 7/2001 | Nishimura | .......... G03F 7/70275 355/72 |
| 2004/0073328 | A1* | 4/2004 | De Haas | ........... H01L 21/67259 700/121 |
| 2006/0126038 | A1* | 6/2006 | Hoogendam | ....... G03F 7/70341 355/52 |
| 2010/0053587 | A1* | 3/2010 | Usui | ..................... G03F 9/7011 355/75 |

(Continued)

FOREIGN PATENT DOCUMENTS

| | | |
|---|---|---|
| JP | 587008 B2 | 12/1993 |
| JP | 4493272 B2 | 6/2010 |

(Continued)

*Primary Examiner* — Colin Kreutzer
(74) *Attorney, Agent, or Firm* — Rossi, Kimms & McDowell LLP

(57) ABSTRACT

The present invention provides a lithography apparatus which forms a pattern on a substrate, including a stage configured to hold the substrate, a substrate transport system configured to transfer the substrate to the stage, an obtaining unit configured to obtain information about a holding state of the substrate on the stage, and a processor configured to perform processing of determining a transport position on the stage when the substrate transport system transfers the substrate to the stage, wherein based on information obtained by the obtaining unit when the stage holds the substrate at each of a plurality of positions on the stage, the processor determines the transport position at which the substrate transport system transfers the substrate to the stage.

9 Claims, 7 Drawing Sheets

(56) References Cited

U.S. PATENT DOCUMENTS

2010/0150695 A1* 6/2010 O'Neill .................. H01L 21/68
　　　　　　　　　　　　　　　　　　　　　　414/806

FOREIGN PATENT DOCUMENTS

| JP | 5231153 | B2 | 7/2013 |
| WO | 02093253 | A1 | 11/2002 |

* cited by examiner

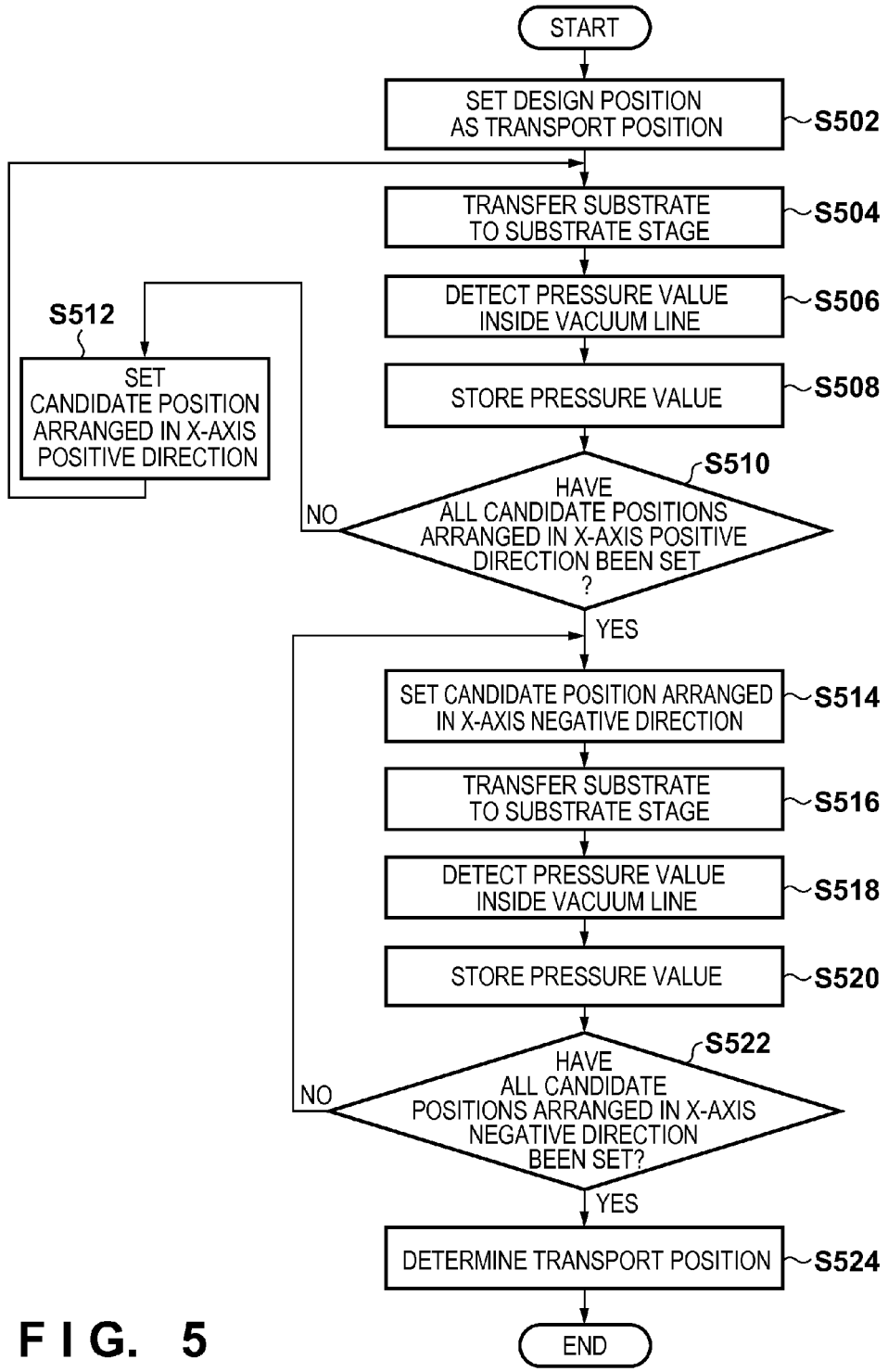
F I G. 5

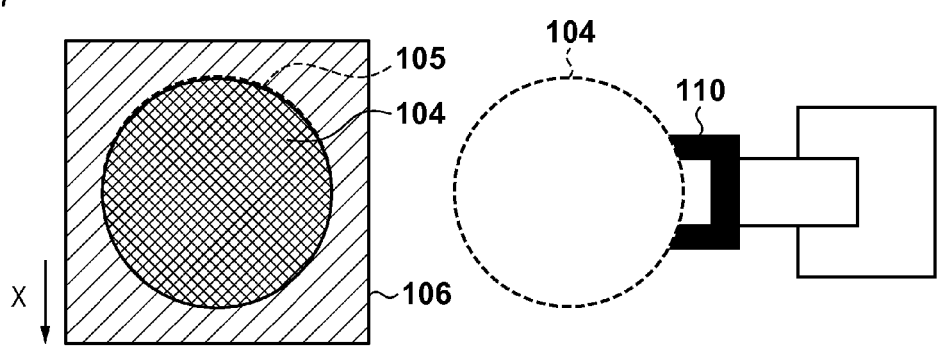
F I G. 7A
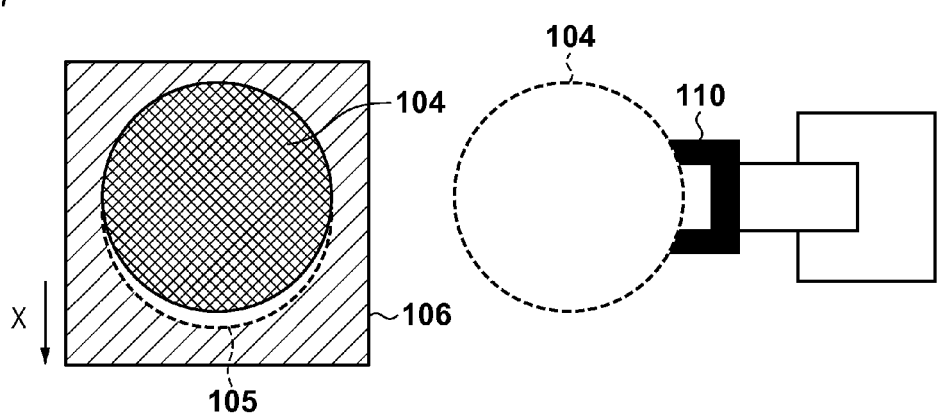
F I G. 7B
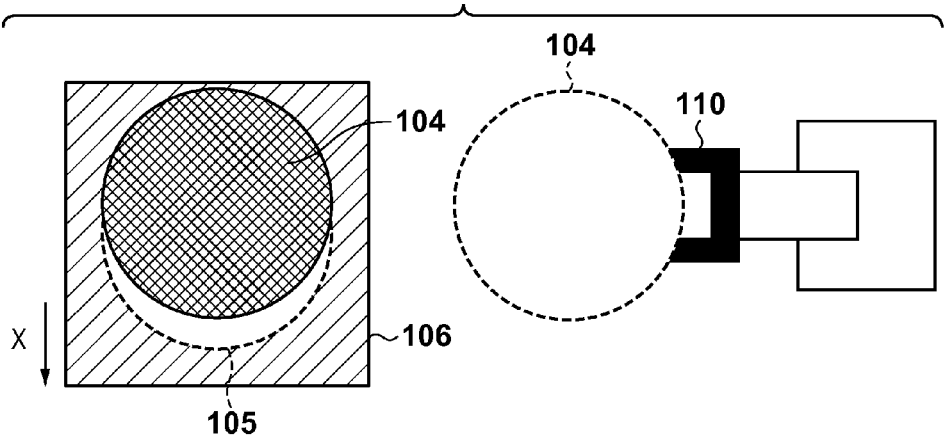
F I G. 7C

F I G. 8A
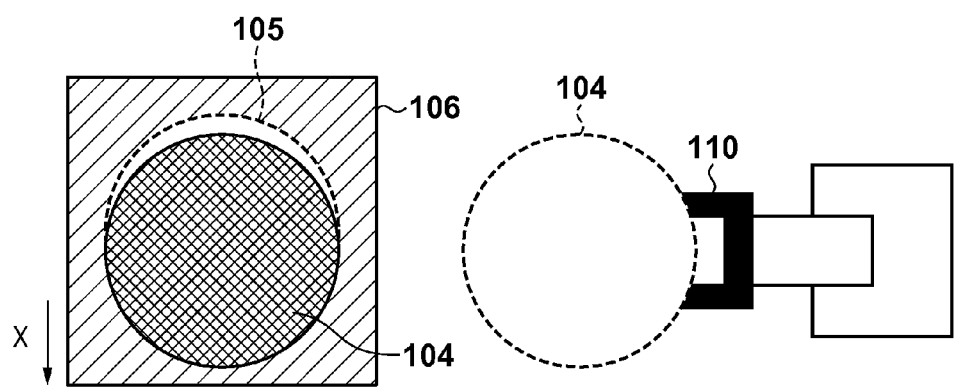
F I G. 8B
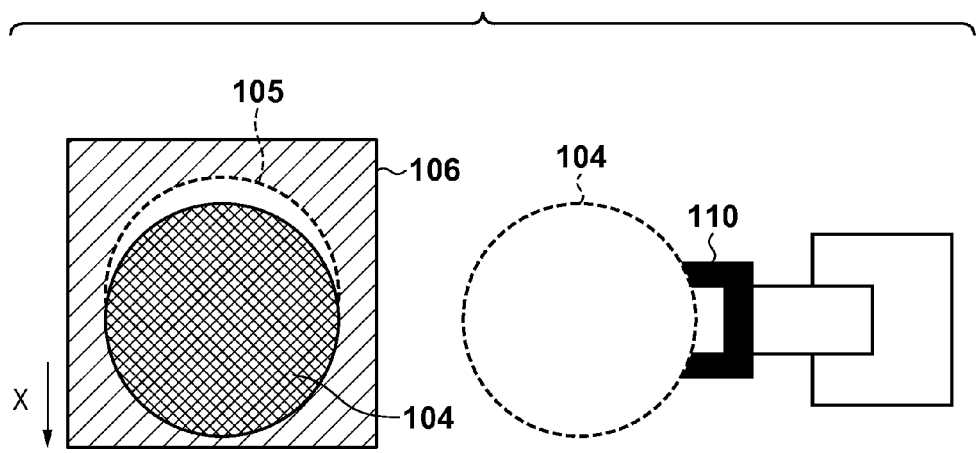

LITHOGRAPHY APPARATUS, DETERMINATION METHOD, AND METHOD OF MANUFACTURING ARTICLE

BACKGROUND OF THE INVENTION

Field of the Invention

The present invention relates to a lithography apparatus, a determination method, and a method of manufacturing an article.

Description of the Related Art

Recently, semiconductor device manufacturing techniques, particularly, micropatterning techniques have made significant progress. Along with this, the number of chips obtainable from one substrate is increasing. There is a need for a technique for ensuring effective chips even in edge shots (partial shots) at the peripheral portion of a substrate to increase the number of effective chips obtained from one substrate (that is, increase the yield).

As semiconductor devices are micropatterned more and more, a projection optical system in, for example, an exposure apparatus serving as one of lithography apparatuses achieves a high NA, and the depth of focus tends to become narrow. Hence, the exposure apparatus is requested to transfer a pattern up to the peripheral portion of a substrate while maintaining a predetermined line width (that is, without defocusing). However, if the substrate holding ability by a substrate chuck (holding surface) is poor, the shape of the peripheral portion of a substrate greatly changes. It is more difficult to ensure the depth of focus at the peripheral portion of a substrate, compared to the central portion of the substrate.

To minimize the defocus, the substrate holding ability by the substrate chuck needs to be maximized. It is therefore important to set a substrate in an optimal positional relationship with respect to the substrate chuck, that is, make the center of the substrate chuck coincide with that of the substrate without a deviation.

To achieve this, Japanese Patent No. 4493272 has proposed a technique of transporting a substrate on which a mark is formed (patterned), detecting the mark by a scope when the substrate is held by a substrate chuck, and obtaining and feeding back the shift amount of the substrate held by the substrate chuck. Japanese Patent Publication No. 5-087008 has proposed a technique of applying a vacuum pressure from the surface of a substrate (that is, mechanically pressing the substrate) to bring the substrate into tight contact with a substrate chuck, thereby improving the flatness of the substrate held by the substrate chuck, regardless of the shift amount of the substrate held by the substrate chuck.

However, in the technique disclosed in Japanese Patent No. 4493272, the positional relationship between the substrate chuck and the substrate is adjusted based on the position of a mark formed on the substrate. If the position of the mark formed on the substrate shifts from a set position, the center of the substrate chuck and the center of the substrate cannot coincide with each other. Since the mark formed on the substrate is detected by the scope, a detection error may arise from the attachment error of the scope itself, or the like.

To the contrary, when a substrate is mechanically pressed from its surface, as in the technique disclosed in Japanese Patent Publication No. 5-087008, a device pattern formed on the substrate may be damaged, or a foreign substance may attach to the substrate.

SUMMARY OF THE INVENTION

The present invention provides a lithography apparatus advantageous for holding a substrate on the holding surface of a stage.

According to one aspect of the present invention, there is provided a lithography apparatus which forms a pattern on a substrate, including a stage configured to hold the substrate, a substrate transport system configured to transfer the substrate to the stage, an obtaining unit configured to obtain information about a holding state of the substrate on the stage, and a processor configured to perform processing of determining a transport position on the stage when the substrate transport system transfers the substrate to the stage, wherein based on information obtained by the obtaining unit when the stage holds the substrate at each of a plurality of positions on the stage, the processor determines the transport position at which the substrate transport system transfers the substrate to the stage.

Further aspects of the present invention will become apparent from the following description of exemplary embodiments with reference to the attached drawings.

BRIEF DESCRIPTION OF THE DRAWINGS

FIG. 5 is a flowchart for explaining processing of determining a transport position on a substrate chuck when the substrate transport system transfers a substrate to the substrate stage in the exposure apparatus shown in FIG. 1.

FIGS. 7A, 7B, and 7C are views each showing the transport position of a substrate on the substrate chuck when the substrate transport system transfers a substrate to the substrate stage.

FIGS. 8A and 8B are views each showing the transport position of a substrate on the substrate chuck when the substrate transport system transfers a substrate to the substrate stage.

DESCRIPTION OF THE EMBODIMENTS

Figure 1:
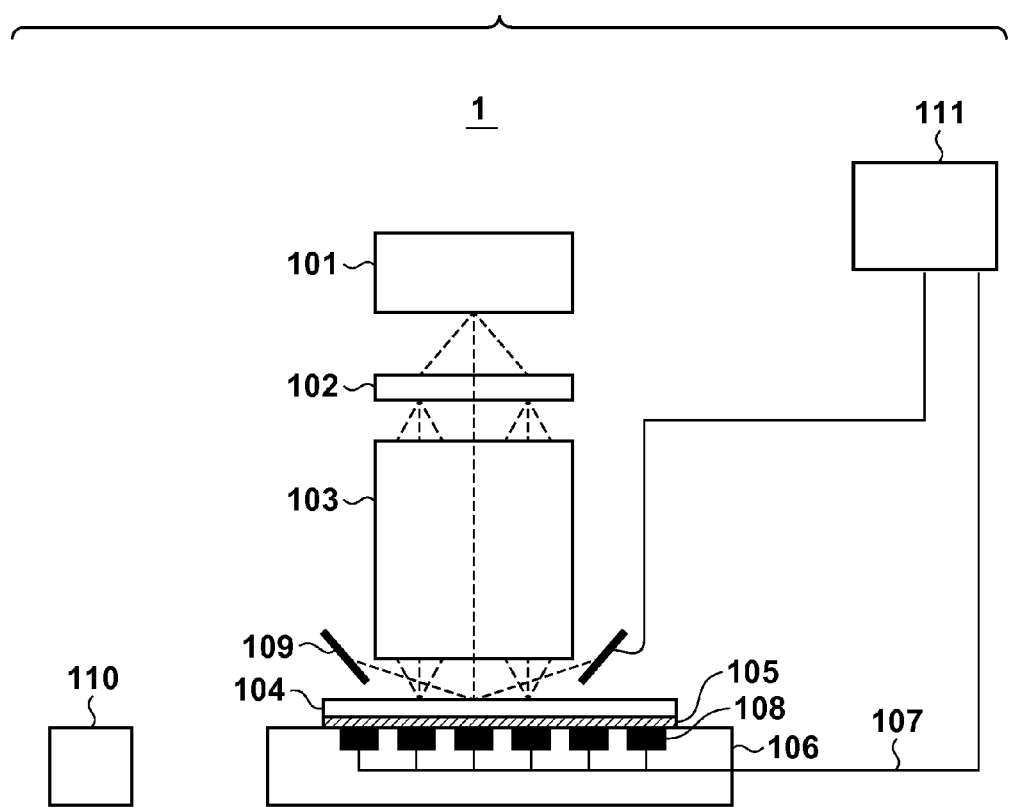
FIG. 1 is a schematic view showing the arrangement of an exposure apparatus as one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 1 as one aspect of the present invention. The exposure apparatus 1 is a lithography apparatus which transfers the pattern of a mask (original) to a substrate, that is, forms a pattern on a substrate. The exposure apparatus 1 includes an illumination optical system 101, a mask stage (not shown) which is movable while holding a mask 102, a projection optical system 103, and a substrate stage 106 which is movable while holding a substrate 104. The exposure apparatus 1 also includes a vacuum line 107, pressure detector 108, focus detector 109, substrate transport system 110, and controller 111.

The illumination optical system 101 is an optical system for illuminating the mask 102 by using light from a light source. The mask 102 has a pattern (device pattern) to be transferred to the substrate 104, is held by the mask stage, and arranged on the object plane of the projection optical system 103. The projection optical system 103 is an optical system which projects, to the substrate 104, (the image of) the pattern of the mask 102 illuminated by the illumination optical system 101.

The substrate stage 106 includes a substrate chuck 105 functioning as a holding surface for holding the substrate 104. For example, the substrate chuck 105 holds the substrate 104 by chucking the substrate 104. The vacuum line 107 is connected to the substrate chuck 105 so that the substrate 104 can be vacuum-chucked. The vacuum line 107 vacuum-chucks the substrate 104 via the substrate chuck 105 by reducing a pressure inside the vacuum line 107.

The pressure detector 108 functions as an obtaining unit which obtains information about the holding state of the substrate 104 on the substrate chuck 105. As this information, the pressure detector 108 detects a pressure value when vacuum-chucking the substrate 104. More specifically, the pressure detector 108 detects a pressure value inside the vacuum line 107 when the vacuum line 107 vacuum-chucks the substrate 104 via the substrate chuck 105.

The focus detector (height detector) 109 functions as an obtaining unit which obtains information about the holding state of the substrate 104 on the substrate chuck 105. As this information, the focus detector 109 detects the height of the substrate 104 held by the substrate chuck 105. More specifically, the focus detector 109 detects the height of the substrate 104 (position in the direction of height on the substrate surface) when the vacuum line 107 vacuum-chucks the substrate 104 via the substrate chuck 105. The focus detector 109 can also detect heights of the substrate 104 at a plurality of portions when the substrate 104 is vacuum-chucked via the substrate chuck 105.

Figure 2:
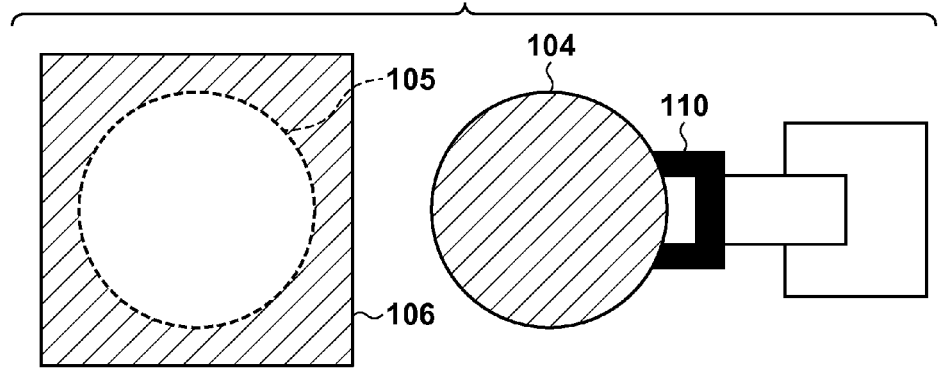
FIG. 2 is a schematic view showing the relationship between a substrate transport system and a substrate stage in the exposure apparatus shown in FIG. 1.

The substrate transport system 110 transports the substrate 104 in the exposure apparatus 1. For example, as shown in FIG. 2, the substrate transport system 110 loads the substrate 104 on which the pattern of the mask 102 is to be transferred, and transfers the substrate 104 to the substrate stage 106. FIG. 2 is a schematic view showing the relationship between the substrate transport system 110 which transports the substrate 104, and the substrate stage 106 which holds the substrate 104. The substrate transport system 110 receives, from the substrate stage 106, the substrate 104 on which the pattern of the mask 102 has been transferred, and unloads the substrate 104 from the exposure apparatus 1.

The controller 111 includes a CPU and memory, and controls the overall (operation of the) exposure apparatus 1. For example, the controller 111 performs exposure processing to expose the substrate 104. Also, the controller 111 performs (functions as a processor) processing of determining a transport position on the substrate chuck 105 (that is, on the holding surface) when the substrate transport system 110 transfers the substrate 104 to the substrate stage 106.

Figure 3:
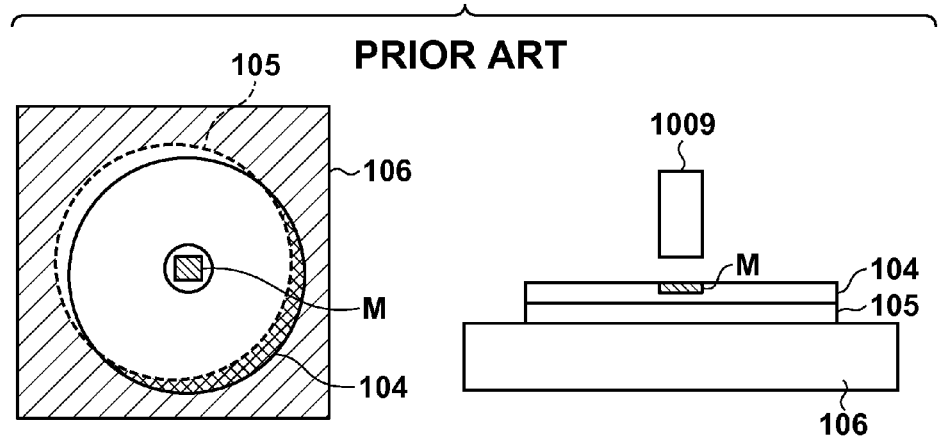
FIG. 3 is a view for explaining the transport of a substrate to a substrate stage in a related art.
Figure 4:
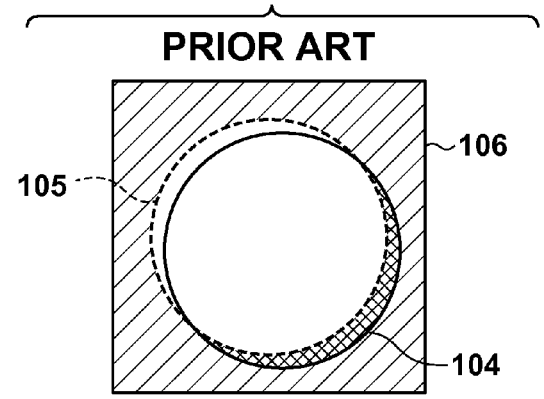
FIG. 4 is a view for explaining the transport of a substrate to the substrate stage in the related art.

The transport of the substrate 104 by the substrate transport system 110 will be explained in detail. In a related art, as shown in FIG. 3, when the substrate chuck 105 holds the substrate 104, a scope 1009 detects a mark M formed on the substrate 104 to obtain and feed back the shift amount of the substrate 104 held by the substrate chuck 105. However, in this case, the center of the substrate 104 and that of the substrate chuck 105 cannot coincide with each other in practice, as shown in FIG. 4, owing to the positional accuracy (shift from the design position) of the mark M formed on the substrate 104, or the tolerance of the scope 1009. In other words, the center positions of the substrate 104 and substrate chuck 105 shift from each other, and the substrate 104 cannot be adjusted to an optimal positional relationship with respect to the substrate chuck 105.

To solve this, according to the embodiment, the transport position is determined based on information about the holding state of the substrate 104 that is obtained when the substrate transport system 110 transfers the substrate 104 to the substrate stage 106 at each of a plurality of candidate positions on the substrate chuck (on the holding surface). This transport position is a position on the substrate chuck when the substrate transport system 110 transfers the substrate 104 to the substrate stage 106, as described above. The candidate position is a position serving as a candidate on the substrate chuck when the substrate transport system 110 transfers the substrate 104 to the substrate stage 106 in obtaining a transport position.

When transporting the substrate 104, the vacuum line 107 chucks the substrate 104 to the substrate chuck 105 so that the substrate 104 does not drop off the substrate stage 106. At this time, the pressure detector 108 detects a pressure value (vacuum pressure value) inside the vacuum line 107. Unless a pressure value enough to chuck the substrate 104 is obtained, an interlock is applied to stop the sequence.

According to the embodiment, for example, the transport position of the substrate 104 with respect to the substrate chuck 105 is determined (adjusted) based on a pressure value detected by the pressure detector 108, and the substrate holding ability (substrate correction force) by the substrate chuck 105 is maximized. More specifically, the relationship between the feed position of the substrate 104, and the reception position of the substrate 104 on the substrate stage 106 is changed. A transport position of the substrate 104 at which a change of the pressure value inside the vacuum line 107 is smallest is determined as an optimal transport position. In other words, as the transport position, a candidate position is determined, at which a pressure value detected by the pressure detector 108 when the substrate transport system 110 transfers the substrate 104 to the substrate stage 106 at each of a plurality of candidate positions becomes equal to or smaller than a predetermined value.

Processing of determining a transport position on the substrate chuck 105 when the substrate transport system 110 transfers the substrate 104 to the substrate stage 106 will be explained with reference to FIG. 5. This processing is executed by performing centralized control of the respective units of the exposure apparatus 1 by the controller 111, as described above. Assume that a plurality of candidate positions are arranged from the center of the substrate chuck 105 in the X-axis positive direction (first direction) and X-axis negative direction (second direction opposite to the first direction).

In step S502, a design position (for example, the center of the substrate chuck 105) is set as a transport position on the substrate chuck 105 when the substrate transport system 110 transfers the substrate 104 to the substrate stage 106.

In step S504, the substrate transport system 110 transports the substrate 104, and transfers the substrate 104 to the substrate stage 106. At this time, the substrate transport system 110 transfers the substrate 104 to the substrate stage 106 at the design position set in step S502, or a candidate position set in step S512. Then, the substrate stage 106 vacuum-chucks (holds), by the substrate chuck 105, the substrate 104 transferred from the substrate transport system 110.

In step S506, the pressure detector 108 detects a pressure value inside the vacuum line 107 in the state in which the substrate chuck 105 vacuum-chucks the substrate 104. In other words, the pressure detector 108 detects a pressure value inside the vacuum line 107 when the substrate chuck 105 vacuum-chucks the substrate 104.

In step S508, the pressure value detected in step S506 is stored in association with the design position set in step S502, or a candidate position set in step S512. This pressure value may be stored in, for example, the memory of the controller 111, or another storage unit arranged in the exposure apparatus 1. Then, the substrate transport system 110 recovers the substrate 104 from the substrate stage 106.

In step S510, it is determined whether all candidate positions arranged in the X-axis positive direction have been set as a transport position on the substrate chuck 105 when the substrate transport system 110 transfers the substrate 104 to the substrate stage 106. If all candidate positions arranged in the X-axis positive direction have been set, the process shifts to step S514. If fewer than all candidate positions arranged in the X-axis positive direction have been set, the process shifts to step S512.

In step S512, one of a plurality of candidate positions arranged in the X-axis positive direction is set as a transport position on the substrate chuck 105 when the substrate transport system 110 transfers the substrate 104 to the substrate stage 106. The process then returns to step S504.

In step S514, one of a plurality of candidate positions arranged in the X-axis negative direction is set as a transport position on the substrate chuck 105 when the substrate transport system 110 transfers the substrate 104 to the substrate stage 106.

In step S516, the substrate transport system 110 transports the substrate 104, and transfers the substrate 104 to the substrate stage 106. At this time, the substrate transport system 110 transfers the substrate 104 to the substrate stage 106 at the candidate position set in step S514. Then, the substrate stage 106 vacuum-chucks (holds), by the substrate chuck 105, the substrate 104 transferred from the substrate transport system 110.

In step S518, the pressure detector 108 detects a pressure value inside the vacuum line 107 in the state in which the substrate chuck 105 vacuum-chucks the substrate 104.

In step S520, the pressure value detected in step S518 is stored in association with the candidate position set in step S514. The substrate transport system 110 recovers the substrate 104 from the substrate stage 106.

In step S522, it is determined whether all candidate positions arranged in the X-axis negative direction have been set as a transport position on the substrate chuck 105 when the substrate transport system 110 transfers the substrate 104 to the substrate stage 106. If all candidate positions arranged in the X-axis negative direction have been set, the process shifts to step S524. If not all candidate positions arranged in the X-axis negative direction have been set, the process returns to step S514.

Figure 6A:
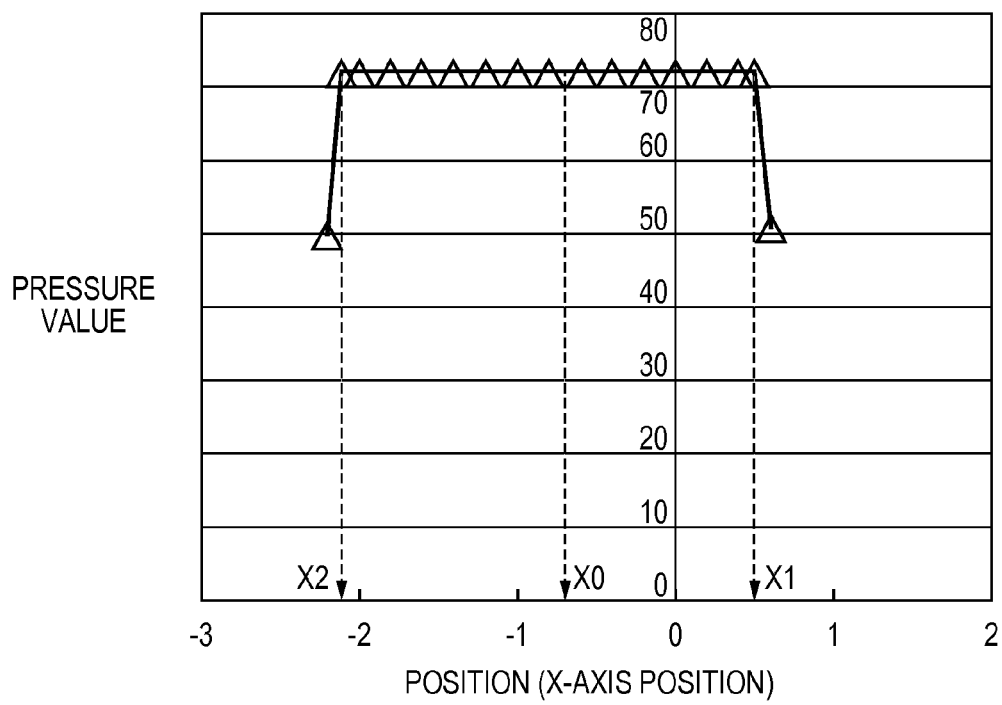
FIGS. 6A and 6B are scatter diagrams each showing the relationship between a position on the substrate chuck when the substrate transport system transfers a substrate to the substrate stage, and a pressure value inside a vacuum line that corresponds to each position.

In step S524, a transport position on the substrate chuck 105 when the substrate transport system 110 transfers the substrate 104 to the substrate stage 106 is determined based on the pressure values stored in steps S508 and S520. A scatter diagram shown in FIG. 6A is obtained by plotting pressure values inside the vacuum line 107 that correspond to respective positions, with respect to the design position and candidate positions, that is, positions (X-axis direction) on the substrate chuck 105 when the substrate transport system 110 transfers the substrate 104 to the substrate stage 106. From this result, a position at which a change of the pressure value inside the vacuum line 107 is smallest is determined as a transport position on the substrate chuck 105 when transferring the substrate 104 to the substrate stage 106. For example, a position at which a change of the pressure value inside the vacuum line 107 is smallest can be regarded as an intermediate position in a region where the pressure value inside the vacuum line 107 does not change when the transport position is changed. More specifically, one first candidate position at which a pressure value detected by the pressure detector 108 becomes equal to or smaller than a predetermined value, for example, a first candidate position X1 farthest from the center of the substrate chuck 105 is obtained from candidate positions arranged in the X-axis positive direction. Similarly, one second candidate position at which a pressure value detected by the pressure detector 108 becomes equal to or smaller than the predetermined value, for example, a second candidate position X2 farthest from the center of the substrate chuck 105 is obtained from candidate positions arranged in the X-axis negative direction. Then, an intermediate position X0 (=(X1+X2)/2) between the first candidate position X1 and the second candidate position X2 is determined as a transport position on the substrate chuck 105 when the substrate transport system 110 transfers the substrate 104 to the substrate stage 106. The predetermined value for a pressure value inside the vacuum line 107 is a pressure value at which the chucking pressure of the substrate 104 does not drop, or the substrate 104 does not drop off the substrate stage 106.

Not the intermediate position X0 between the first candidate position X1 and the second candidate position X2, but a position between the first candidate position X1 and the second candidate position X2 may be determined as a transport position on the substrate chuck 105 when the substrate transport system 110 transfers the substrate 104 to the substrate stage 106. The transport position is not limited to a candidate position, and a position in a range where a pressure value inside the vacuum line 107 becomes equal to or smaller than the predetermined value can be determined as the transport position. Alternatively, a candidate position at which a pressure value detected by the pressure detector 108 becomes equal to or smaller than the predetermined value may be determined as a transport position on the substrate chuck 105 when the substrate transport system 110 transfers the substrate 104 to the substrate stage 106.

Figure 6B:
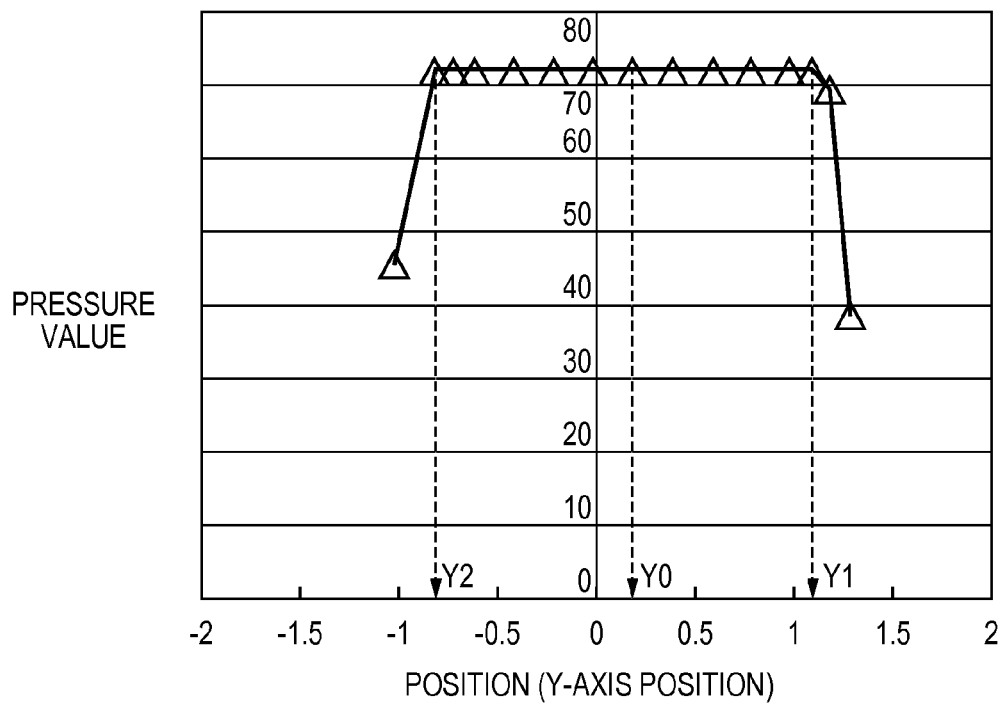

Similarly for the Y-axis direction, a plurality of candidate positions are arranged from the center of the substrate chuck 105 in the Y-axis positive direction and Y-axis negative direction, and the processes in steps S502 to S524 are performed. A scatter diagram shown in FIG. 6B is obtained by plotting pressure values inside the vacuum line 107 that correspond to respective positions, with respect to positions (Y-axis direction) on the substrate chuck 105 when the substrate transport system 110 transfers the substrate 104 to the substrate stage 106. Accordingly, an intermediate position Y0(=(Y1+Y2)/2) between a first candidate position Y1 and a second candidate position Y2 can be determined as a transport position on the substrate chuck 105 when the substrate transport system 110 transfers the substrate 104 to the substrate stage 106.

In this manner, according to the embodiment, the transport position on the substrate chuck 105 when the substrate transport system 110 transfers the substrate 104 to the substrate stage 106 can be adjusted to an optimal position, thereby maximizing the substrate holding ability by the substrate chuck 105. After determining the transport position on the substrate chuck 105 when transferring the substrate 104 to the substrate stage 106, the transport position is stored in, for example, the memory of the controller 111, and is reflected at the time of the next substrate transport.

It is also possible to detect a pressure value inside the vacuum line 107 by the pressure detector 108 while changing the transport position on the substrate chuck 105 in the X-axis positive direction when the substrate transport system 110 transfers the substrate 104 to the substrate stage 106, as shown in FIGS. 7A to 7C. At this time, the transport position on the substrate chuck 105 is repetitively changed in the X-axis positive direction until a position at which a pressure value inside the vacuum line 107 becomes equal to or smaller than the predetermined value, and a position at which a pressure value inside the vacuum line 107 becomes larger than the predetermined value are detected. Similarly, the pressure detector 108 detects a pressure value inside the vacuum line 107 while changing the transport position on the substrate chuck 105 in the X-axis negative direction when the substrate transport system 110 transfers the substrate 104 to the substrate stage 106, as shown in FIGS. 8A and 8B. At this time, the transport position on the substrate chuck 105 is repetitively changed in the X-axis negative direction until a position at which a pressure value inside the vacuum line 107 becomes equal to or smaller than the predetermined value, and a position at which a pressure value inside the vacuum line 107 becomes larger than the predetermined value are detected.

Also, the transport position on the substrate chuck 105 may be changed so that the transport position on the substrate chuck 105 when the substrate transport system 110 transfers the substrate 104 to the substrate stage 106 sequentially changes to the states shown in FIGS. 7C, 7B, 7A, 8A, and 8B. In other words, the transport position on the substrate chuck 105 may be successively changed in the X-axis direction without separating the X-axis positive direction and X-axis negative direction.

The transport position in the X-axis direction and the transport position in the Y-axis direction on the substrate chuck 105 when the substrate transport system 110 transfers the substrate 104 to the substrate stage 106 can be obtained completely independently, and are not influenced by the mutual results.

By setting a plurality of candidate positions at a finer pitch, the transport position on the substrate chuck 105 when the substrate transport system 110 transfers the substrate 104 to the substrate stage 106 can be determined at higher accuracy.

The transport position on the substrate chuck 105 when the substrate transport system 110 transfers the substrate 104 to the substrate stage 106 can also be determined based on the height of the substrate 104 that is detected by the focus detector 109, instead of a pressure value inside the vacuum line 107. More specifically, the substrate 104 is transferred to the substrate stage 106 at each of a plurality of candidate positions. The focus detector 109 detects the height of the substrate 104 chucked by the substrate chuck 105. The range (detection range) where the focus detector 109 can detect the height of the substrate 104 is about several ten μm. Hence, in a state in which the substrate chuck 105 does not satisfactorily chuck the substrate 104, a portion at which the surface of the substrate 104 does not fall within the detection range of the focus detector 109 is generated. In other words, it can be considered that the substrate 104 is held by the substrate chuck 105 in a flatter state as the number (effective detection count) of portions at which the focus detector 109 can measure a height is larger. From this, a candidate position at which a height detected by the focus detector 109 when the substrate 104 is transferred to the substrate stage 106 at each of a plurality of candidate positions falls within a predetermined range is determined as a transport position on the substrate chuck 105. When the focus detector 109 detects heights of the substrate 104 at a plurality of portions, a candidate position at which the number of portions where detected heights at a plurality of portions fall within the predetermined range is largest, out of a plurality of candidate positions, may be determined as a transport position on the substrate chuck 105.

Figure 9A:
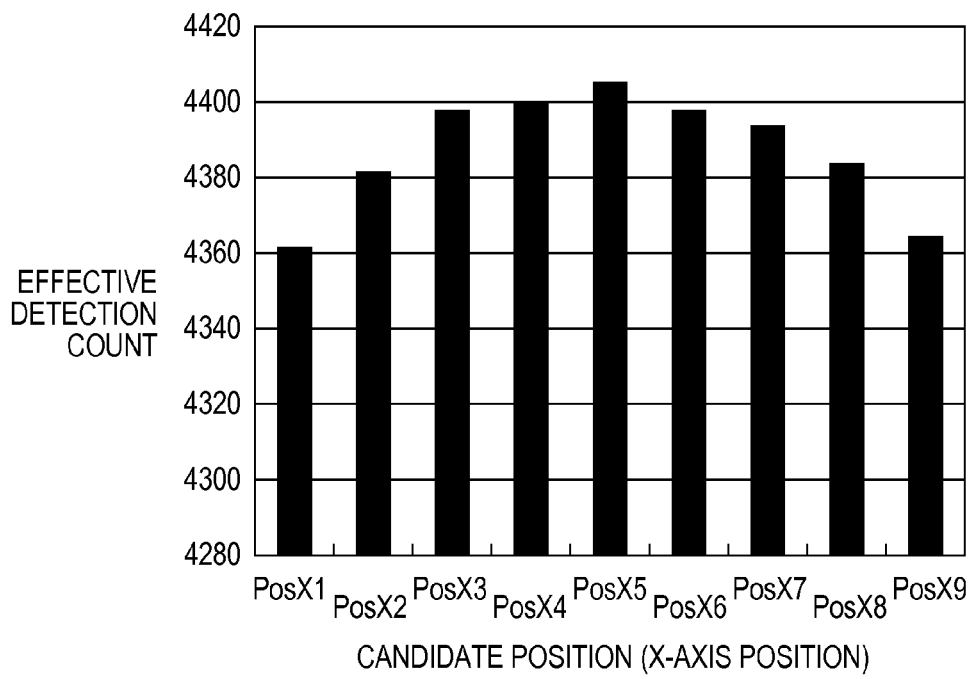
FIGS. 9A and 9B are graphs each showing an effective detection count for each candidate position by which a focus detector detects the height of a substrate.
Figure 9B:
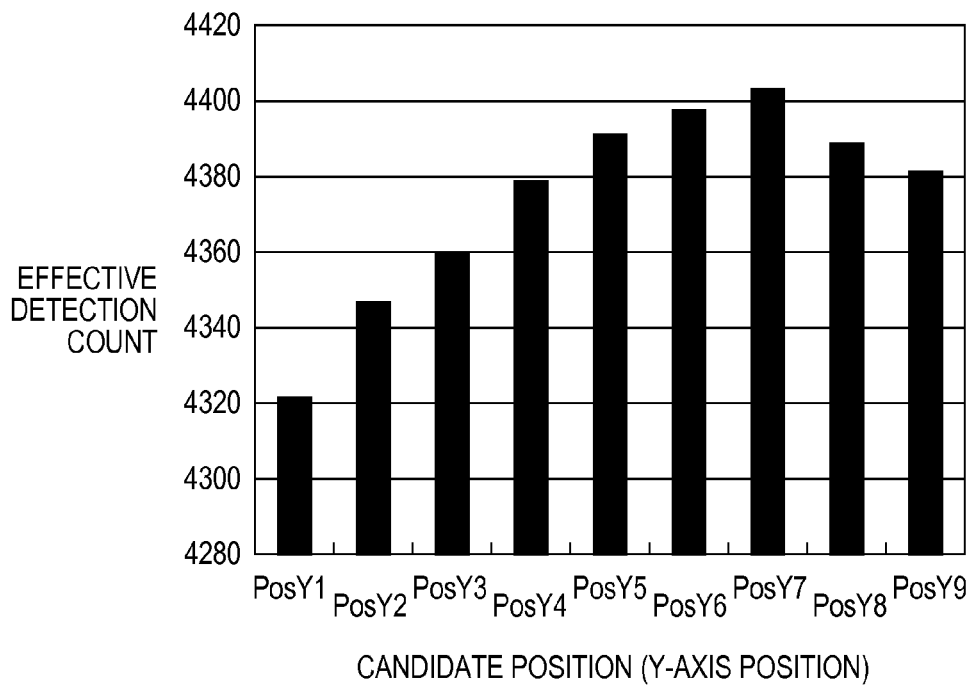

FIG. 9A is a graph showing an effective detection count on an 8"-substrate for each candidate position when a plurality of candidate positions are set at a 4-mm pitch in the X-axis direction, and the focus detector 109 detects heights of the substrate 104. FIG. 9B is a graph showing an effective detection count on an 8"-substrate for each candidate position when a plurality of candidate positions are set at a 4-mm pitch in the Y-axis direction, and the focus detector 109 detects heights of the substrate 104. In this case, a candidate position PosX5 is determined as a transport position in the X-axis direction on the substrate chuck 105 when the substrate transport system 110 transfers the substrate 104 to the substrate stage 106. Also, a candidate position PosY7 is determined as a transport position in the Y-axis direction on the substrate chuck 105 when the substrate transport system 110 transfers the substrate 104 to the substrate stage 106.

It is also possible to transfer the substrate 104 to the substrate stage 106 at each of a plurality of candidate positions, expose the substrate 104 in each state, and determine, as a transport position on the substrate chuck 105, a candidate position at which the exposure result (focus accuracy) is best. At this time, the focus accuracy may be confirmed based on the CD (line width) uniformity. Alternatively, the in-plane focus accuracy may be confirmed using a mask capable of directly grasping a defocus amount.

When the warping amount (shape) of the substrate 104 is different, a transport position optimal for each substrate 104 (that is, a position at which the substrate 104 can be satisfactorily chucked and held) may be different. In such a case, the transport position on the substrate chuck 105 when the substrate transport system 110 transfers the substrate 104 to the substrate stage 106 may be determined for, for example, each recipe or each lot of a device. More specifically, for a device which is processed for the first time in the exposure apparatus 1, a transport position on the substrate chuck 105 is automatically determined at the time of executing a recipe for the first time, and the transport position on the substrate chuck 105 is set to be changeable for each recipe or each lot.

Exposure processing by the exposure apparatus 1 will be explained. Light emitted by a light source illuminates the mask 102 via the illumination optical system 101. The light which has passed through the mask 102 and reflects a pattern forms, via the projection optical system 103, an image on the substrate 104 held by the substrate stage 106. In the embodiment, the transport position on the substrate chuck 105 when the substrate transport system 110 transfers the substrate 104 to the substrate stage 106 is determined to be an optimal position, so the substrate holding ability by the substrate chuck 105 can be maximized. The substrate stage 106 can hold the substrate 104 without dropping the substrate 104 or damaging the substrate 104. Therefore, the exposure apparatus 1 can transfer a pattern up to the peripheral portion of the substrate 104 while maintaining a predetermined line width (that is, without defocusing), and can provide a high-quality article such as a device at a high throughput and high cost effectiveness.

A method of manufacturing an article according to the embodiment of the present invention is suitable for manufacturing an article such as a microdevice (for example, a semiconductor device) or an element having a microstructure. The manufacturing method includes a step of forming, by using the exposure apparatus 1, a pattern on a substrate coated with a photoresist, and a step of processing (for example, developing) the substrate on which the pattern has been formed. Subsequently to the forming steps, the manufacturing method can include other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

Note that the lithography apparatus is not limited to the exposure apparatus, and may be a drawing apparatus which forms a pattern on a substrate by performing drawing on the substrate with a charged particle beam (for example, electron beam or ion beam) via a charged particle optical system. The lithography apparatus may be an imprint apparatus which forms a pattern on a substrate by molding, with a mold, an imprint material (for example, resin) on the substrate. Further, the present invention is applicable not only to the lithography apparatus, but also an apparatus in which a stage for chucking and holding a substrate is arranged, and the flatness of a substrate influences the apparatus performance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-220484 filed on Oct. 23, 2013, which is hereby incorporated by reference herein in its entirety.

What is claimed is:

1. A lithography apparatus which forms a pattern on a substrate, comprising:
   a stage configured to hold the substrate;
   a substrate transport system configured to transfer the substrate to the stage;
   an obtaining unit configured to obtain information about a holding state of the substrate on the stage; and
   a processor configured to perform processing of determining a transport position on the stage when the substrate transport system transfers the substrate to the stage,
   wherein based on information obtained by the obtaining unit when the stage holds the substrate at each of a plurality of positions on the stage, the processor determines the transport position at which the substrate transport system transfers the substrate to the stage.

2. The apparatus according to claim 1, further comprising a vacuum line configured to vacuum-chuck the substrate via the stage,
   wherein the obtaining unit includes a pressure detector configured to detect, as the information, a pressure value inside the vacuum line when the substrate is vacuum-chucked, and
   the processor determines, as the transport position, a position at which the pressure value detected by the pressure detector when the substrate is held at each of the plurality of positions becomes not larger than a predetermined value.

3. The apparatus according to claim 2, wherein
   the plurality of positions are arranged as candidate positions of the transport position from a center of the stage in a first direction and a second direction opposite to the first direction, and
   the processor obtains, from the candidate positions arranged in the first direction, one first candidate position at which the pressure value detected by the pressure detector becomes not larger than the predetermined value, obtains, from the candidate positions arranged in the second direction, one second candidate position at which the pressure value detected by the pressure detector becomes not larger than the predetermined value, and determines, as the transport position, a position between the first candidate position and the second candidate position.

4. The apparatus according to claim 3, wherein the first candidate position and the second candidate position are candidate positions farthest from the center of the stage, out of candidate positions at which the pressure value detected by the pressure detector becomes not larger than the predetermined value.

5. The apparatus according to claim 3, wherein the processor determines, as the transport position, an intermediate position between the first candidate position and the second candidate position.

6. The apparatus according to claim 1, wherein
   the obtaining unit includes a height detector configured to detect, as the information, a height of the substrate when the substrate is held by the stage, and
   the processor determines, as the transport position, a position at which the height detected by the height detector when the substrate is transferred to the stage at each of the plurality of positions falls within a predetermined range.

7. The apparatus according to claim 6, wherein
   the height detector detects heights of the substrate at a plurality of portions when the substrate is chucked by the stage, and
   the processor determines, as the transport position, a position at which the number of portions where heights detected by the height detector at the plurality of portions fall within the predetermined range is largest, out of the plurality of positions.

8. A determination method of determining a transport position on a stage when a substrate transport system transfers a substrate to the stage configured to hold the substrate in a lithography apparatus including the stage, and the substrate transport system, comprising:
   a first step of obtaining information about a holding state of the substrate on the stage when the stage holds the substrate at each of a plurality of positions on the stage; and
   a second step of determining the transport position based on information obtained in the first step for each of the plurality of positions.

9. A method of manufacturing an article, the method comprising:

forming a pattern on a substrate using a lithography apparatus; and processing the substrate on which the pattern has been transferred, wherein the lithography apparatus includes:

a stage configured to hold the substrate;

a substrate transport system configured to transfer the substrate to the stage;

an obtaining unit configured to obtain information about a holding state of the substrate on the stage; and a processor configured to perform processing of determining a transport position on the stage when the substrate transport system transfers the substrate to the stage, wherein based on information obtained by the obtaining unit when the stage holds the substrate at each of a plurality of positions on the stage, the processor determines the transport position at which the substrate transport system transfers the substrate to the stage.

* * * * *